US 6,980,408 B2

(12) United States Patent
Sakihama et al.

(10) Patent No.: US 6,980,408 B2
(45) Date of Patent: Dec. 27, 2005

(54) ESD PROTECTION CIRCUIT HAVING A CONTROL CIRCUIT

(75) Inventors: Kazuhisa Sakihama, Yokohama (JP); Akira Yamaguchi, Kitaadachi-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/699,827

(22) Filed: Nov. 4, 2003

(65) Prior Publication Data

US 2005/0030688 A1    Feb. 10, 2005

(30) Foreign Application Priority Data

Aug. 4, 2003    (JP) .............................. 2003-205735

(51) Int. Cl.[7] .............................. H02H 9/00; H02H 3/22
(52) U.S. Cl. .................. 361/91.1; 361/56; 361/111
(58) Field of Search .................. 361/91.1, 111, 361/56, 41

(56) References Cited

U.S. PATENT DOCUMENTS

| | | | | |
|---|---|---|---|---|
| 5,151,611 A | * | 9/1992 | Rippey | 327/525 |
| 5,272,371 A | * | 12/1993 | Bishop et al. | 257/362 |
| 5,280,235 A | * | 1/1994 | Neale et al. | 323/314 |
| 5,400,202 A | * | 3/1995 | Metz et al. | 361/56 |
| 5,682,049 A | * | 10/1997 | Nguyen | 257/363 |
| 5,841,723 A | * | 11/1998 | Ma | 365/225.7 |
| 5,959,820 A | * | 9/1999 | Ker et al. | 361/111 |
| 5,995,354 A | * | 11/1999 | Yu | 361/111 |
| 6,249,410 B1 | * | 6/2001 | Ker et al. | 361/56 |
| 6,365,938 B2 | * | 4/2002 | Lee et al. | 257/355 |
| 6,556,409 B1 | * | 4/2003 | Chittipeddi et al. | 361/111 |

FOREIGN PATENT DOCUMENTS

| | | |
|---|---|---|
| JP | 5-121662 | 5/1993 |
| JP | 8-97376 | 4/1996 |
| JP | 2000-49293 | 2/2000 |

OTHER PUBLICATIONS

A. Sedra et al., Microelectronics Circuits, 1987, Holt, Reinhart and Winston, pp. 342-345.*
Albert Z.H Wang, "On-Chip ESD Protection for Integrated Circuits, An IC Design Perspective", p. 103, no date.

* cited by examiner

Primary Examiner—Brian Sircus
Assistant Examiner—Zeev Kitov
(74) Attorney, Agent, or Firm—Oblon, Spivak, McClelland, Maier & Neustadt, P.C.

(57) ABSTRACT

An ESD protection circuit comprising a first pad, a second pad, and a clamp circuit. The first pad is used as an external connection terminal to be connected to a semiconductor integrated circuit. The second pad is used as an external connection terminal to be connected to the semiconductor integrated circuit. The clamp circuit is connected between the first pad and the second pad. The ESD protecting circuit further comprises a control circuit. The control circuit controls the clamp circuit, rendering the same conducting or non-conducting.

15 Claims, 8 Drawing Sheets

ESD PROTECTION CIRCUIT HAVING A CONTROL CIRCUIT

CROSS-REFERENCE TO RELATED APPLICATIONS

This application is based upon and claims the benefit of priority from the prior Japanese Patent Application No. 2003-205735, filed Aug. 4, 2003, the entire contents of which are incorporated herein by reference.

BACKGROUND OF THE INVENTION

1. Field of the Invention

The present invention relates to an ESD protection circuit designed to protect ICs (Integrated Circuits) and LSIs (Large-Scale Integration Circuits) from ESD (Electrostatic Discharge).

2. Description of the Related Art

Various ESD protection circuits have hitherto been proposed. They are designed to protect semiconductor integrated circuits, such as ICs and LSIs, from high voltages resulting from ESD. Three types of conventional ESD protection circuits will be described, with reference to FIGS. 1 to 5.

FIG. 1 is a circuit diagram schematically showing a first conventional ESD protection circuit.

As FIG. 1 shows, the circuit comprises two pads 11 and 12, and a clamp circuit 14. An internal circuit 13 to be protected against ESD is connected to both pads 11 and 12. The clamp circuit 14 is provided between and connected to the pads 11 and 12. The clamp circuit comprises an NMOS transistor 18. The transistor 18 has its drain and source connected to the first pad 11 and the second pad 12, respectively. The gate and back gate of the transistor 18 are connected to source of the transistor 18.

How the circuit of FIG. 1 operates will be described with reference to FIG. 2. FIG. 2 is a graph representing the voltage-current characteristic of the NMOS transistor 18 shown in FIG. 1. In FIG. 2, the voltage V1 applied between the drain and source of the transistor 18 is plotted on the abscissa, and the current I1 flowing between the drain and source of the transistor 18 is plotted on the coordinate.

No high voltage due to ESD may be applied between the first and second pads 11 and 12 (region 1). In this case, no current flows between the drain and source of the NMOS transistor 18 of the clamp circuit 14. This is because the transistor 18 is not on (not conducting) since its gate and source are connected to each other and therefore remain at the same potential. Thus, the internal circuit 13 can operate in normal way.

When high voltage resulting from ESD is applied between the first and second pads 11 and 12 (region 2), the NMOS transistor 18 is turned on. As a result, the ESD charge passes from the first pad 11 to the second pad 12 via the clamp circuit 14. That is, no high voltage is applied to the internal circuit 13. In other words, the internal circuit 13 is protected.

The voltage-current characteristics of the NMOS transistor 18 exhibited in the region 2 will be described in detail. When a high voltage is applied between the drain and source of the NMOS transistor 18, the voltage across the drain-source path rises to the trigger voltage Vt1, causing a snap-back in the transistor NMOS 18, as illustrated in FIG. 2. The snap-back lowers the voltage to a hold voltage Vh. Then, a current can abruptly flow in the NMOS transistor 18.

The current flowing in the NMOS transistor 18 at this time is an off-current. The off-current flows from the drain to the source by virtue of a bipolar action. It is not an on-current that flows the channel of the transistor 18.

The ESD-protection circuit of the configuration shown in FIG. 1 should satisfy the following two design requirements. First, the withstand voltage of the internal circuit 13 (at which the circuit 13 may break down) must be higher than the trigger voltage Vt1 of the NMOS transistor 18. Second, the hold voltage Vh must be higher than the power-supply voltage Vdd of the internal circuit 13. The second requirement should be satisfied in order to prevent the clamp circuit 14 from turning on while the internal circuit 13 is operating in normal condition.

In recent years the technology of manufacturing semiconductor devices has advanced, making it possible to provide smaller and smaller semiconductor elements. Consequently, the gate withstand voltage of MOSFETs has much reduced. MOSFETs made by the 0.18 to 0.13-micron process, for example, have a trigger voltage Vt1 that is almost the same as the gate withstand voltage. Furthermore MOSFETs made by the 0.09-micron process have a trigger voltage Vt1 that is lower than the gate withstand voltage. In view of the microelectronic processes to be developed in the future, it will be difficult to satisfy the first design requirement specified above.

A second conventional ESD protection circuit will be described with reference to FIGS. 3 and 4. FIG. 3 is a schematic representation of the second conventional ESD protection circuit 2.

This ESD protection circuit differs from the first conventional ESD protection circuit, only in that it has a time-constant circuit 23. Such a time-constant circuit is disclosed in, for example, U.S. Pat. No. 6,249,410 (Jun. 19, 2001) and illustrated in FIG. 4 of the U.S. patent.

The time-constant circuit 23 comprises a capacitor C and a resistor R. One electrode of the capacitor C is connected to the pad 11. The other electrode of the capacitor C is connected to the gate of the NMOS transistor 18. The resistor R is connected at one end to the gate of the NMOS transistor 18 and at the other end to the pad 12.

How the second conventional ESD protection circuit operates will be explained, with reference to FIG. 4. FIG. 4 is a graph representing the voltage-current characteristic of the NMOS transistor 18 shown in FIG. 3. In FIG. 4, the voltage V1 applied between the drain and source of the NMOS transistor 18 is plotted on the abscissa, and the current I1 flowing between the drain and source of the NMOS transistor 18 is plotted on the coordinate.

Unless a high voltage resulting from ESD is applied between the first and second pads 11 and 12, the clamp circuit 14 is off as in the circuit illustrated in FIG. 1. Hence, the internal circuit 13 need not be protected from high voltages and can operate in normal way.

When a high voltage resulting from ESD is applied between the first and second pads 11 and 12, the time-constant circuit 23 generates a pulse that remains at high level for a specified time. The pulse is supplied to gate of the NMOS transistor 18, turning the NMOS transistor 18 on. Thus, the clamp circuit is turned on.

The ESD charge resulting from electrostatic discharge (ESD) is therefore transferred to the second pad 12 through the clamp circuit 14. This protects the internal circuit 13 from the high voltage generated from the ESC. The specific time mentioned above is determined by the time constant that is the product of the capacitance of the capacitor C and the resistance of the resistor R.

The voltage-current characteristic that the NMOS transistor 18 has when a high voltage resulting from ESD is applied between the first pad 11 and the second pad 12 will be described in detail, with reference to FIG. 4.

In FIG. 4, the solid line 25 indicates the voltage-current characteristic that the NMOS transistor 18 exhibits when a current resulting from the ESD flows in the channel of the NMOS transistor 18. In other words, the NMOS transistor 18 has this characteristic while it remains on. The broken line 26 shown in FIG. 4 represents the voltage-current characteristic that the NMOS transistor 18 exhibits when snap-back occurs as in the first conventional ESD protection circuit. That is, the broken line 26 depicts the characteristic the NMOS transistor 18 has while it remains off. As the comparison of FIG. 4 with FIG. 2 reveals, a larger current can flow in the NMOS transistor 18 than in the first conventional ESD protection circuit. Thus, the second conventional ESD protection circuit can protect the internal circuit 13 more reliably than the first conventional ESD protection circuit. Note that the characteristic of the solid line 25 pertains to the on-current that flows in the channel formed between the source and drain of the NMOS transistor 18, unlike in the first conventional ESD protection circuit. The current that flows in the NMOS transistor 18 and changes as indicated by the broken line 26 is an off-current that does not flow in the channel due to a bipolar action.

As can be understood from the above, the second conventional ESD protection circuit utilizes the on-current of the NMOS transistor 18, not the off-current thereof. Therefore, the first design requirement that the withstand voltage of the internal circuit 13 must be higher than the trigger voltage Vt1 of the NMOS transistor 18 need not be taken into consideration to design the second conventional ESD protection circuit. It is difficult, however, to design the time-constant circuit 23 incorporated in the second conventional ESD protection circuit. That is, if the time constant (i.e., the product of the capacitance of the capacitor C and the resistance of the resistor R) is small, the on-time of the NMOS transistor 18 will be short, disabling the circuit 2 to protect the internal circuit 13 effectively. If the time constant is large, the on-time will be long, enabling the circuit 2 to protect the internal circuit effectively. To acquire a sufficiently large time constant, the circuit 23 must comprises a capacitor and a resistor that have a high capacitance and a high resistance, respectively. This will increase the size and manufacturing cost of the chip incorporating the circuit 2 and the internal circuit 13. This is particularly because one time-constant circuit should be provided for each pad provided in the chip.

A third conventional ESD protection circuit will be described with reference to FIG. 5. FIG. 5 is a schematic representation of this circuit 3. Such an ESD protection circuit is disclosed in Albert Z. H. Wang, ON-CHIP ESD PROTECTION FOR INTEGRATED CIRCUITS, An IC Design Perspective, FIG. 4–24, Kluwer Academic Publishers Group.

As FIG. 5 illustrates, the third conventional ESD protection circuit comprises a clamp circuit 14, a time-constant circuit 23, and an inverter circuit 30. The inverter circuit 30 comprises three inverters 30-1, 30-2 and 30-3. The inverters 30-1 to 30-3 are provided between the clamp circuit 14 and the time-constant circuit 23. The inverters 30-1 to 30-3 have their input terminals connected to one another, and their output terminals connected to one another.

The first inverter 30-1 comprises a PMOS transistor P-1 and an NMOS transistor N-1. The second inverter 30-2 comprises a PMOS transistor P-2 and an NMOS transistor N-2. The third inverter 30-3 comprises a PMOS transistor P-3 and an NMOS transistor N-3. The first inverter 30-1 has its input terminal connected to the node 24 of the time-constant circuit 23, and its output terminal connected to the input terminal of the second inverter 30-2. The output terminal of the second inverter 30-2 is connected to the input terminal of the third inverter 30-3. The output terminal of the third inverter 30-3 is connected to the gate of the NMOS transistor 18 incorporated in the clamp circuit 14.

How the third conventional ESD protection circuit operates will be explained. Assume that a high voltage generated from ESD is applied between the first pad 11 and the second pad 12. Then, the time-constant circuit 23 and the inverter circuit 30 cooperate, generating a signal. The signal is supplied to the clamp circuit 14. In the clamp circuit 14, the signal turns on the NMOS transistor 18. The ESD charge applied to the first pad 11 is thereby transferred to the second pad 12 via the clamp circuit 14. The internal circuit 13 is thus protected. The third conventional ESD protection circuit operates in the same way as the second conventional ESD protection circuit in other points.

Having the time-constant circuit 23, the conventional ESD protection circuit 3 has the same disadvantage as the conventional ESD protection circuit 2. Further, it is more disadvantageous than the circuit 2 in terms of size and manufacturing cost because it includes the inverter circuit 30.

As described above, the conventional ESD protection circuits cannot sufficiently protect the internal circuit, is difficult to design and manufacture in small size, and is disadvantageous in size and manufacturing cost.

BRIEF SUMMARY OF THE INVENTION

According to an aspect of the invention there is provided an ESD protection circuit that comprises, a first pad which is used as an external connection terminal to be connected to a semiconductor integrated circuit, a second pad which is used as an external connection terminal to be connected to the semiconductor integrated circuit, a clamp circuit connected between the first pad and the second pad, and a control circuit which is configured to control the clamp circuit, rendering the same conducting or non-conducting.

DETAILED DESCRIPTION OF THE INVENTION

Figure 1:
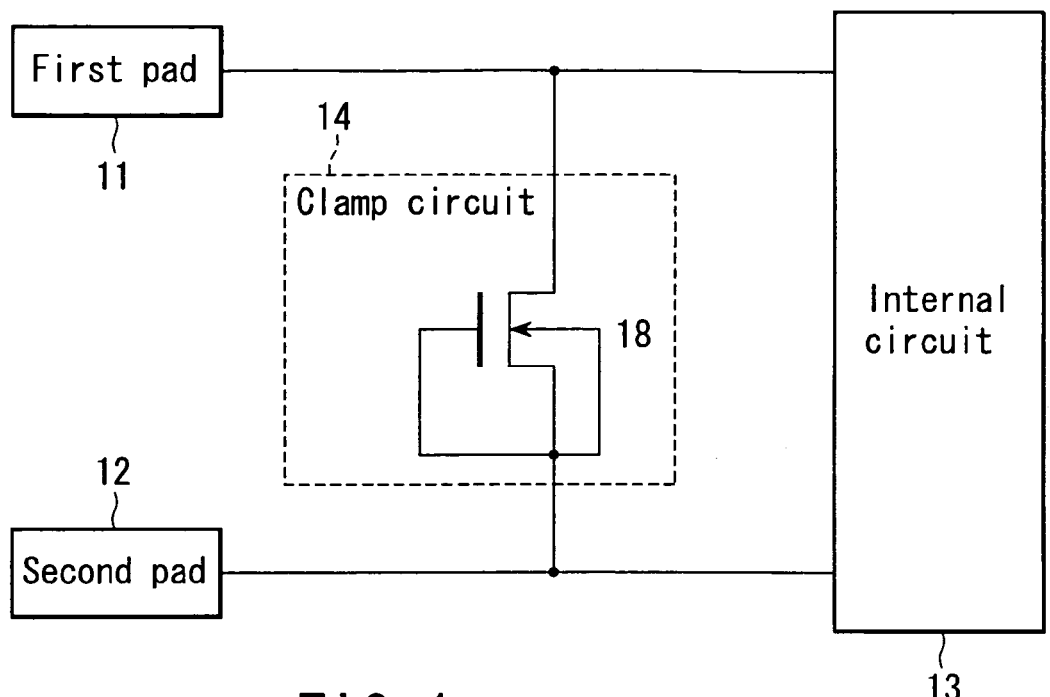
FIG. 1 is a circuit diagram showing a first conventional ESD protection circuit.
Figure 2:
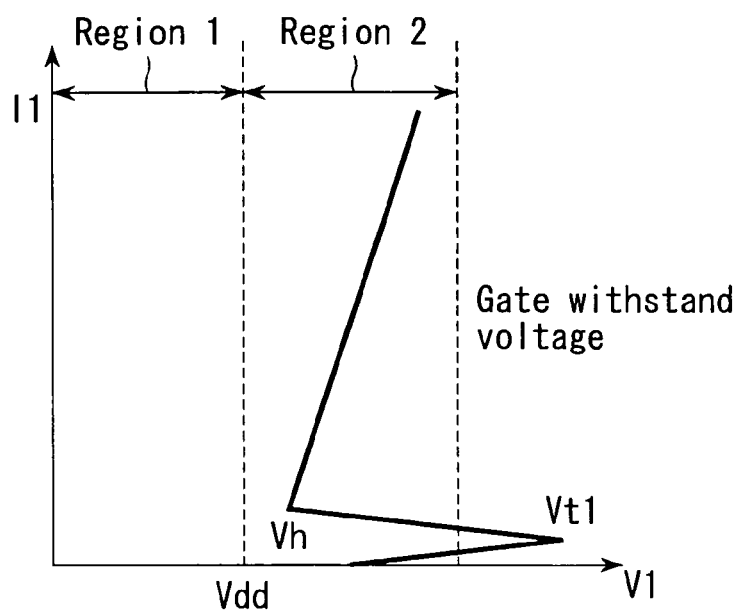
FIG. 2 is a graph representing the voltage-current characteristic of the clamp circuit incorporated in the first conventional ESD protection circuit.
Figure 3:
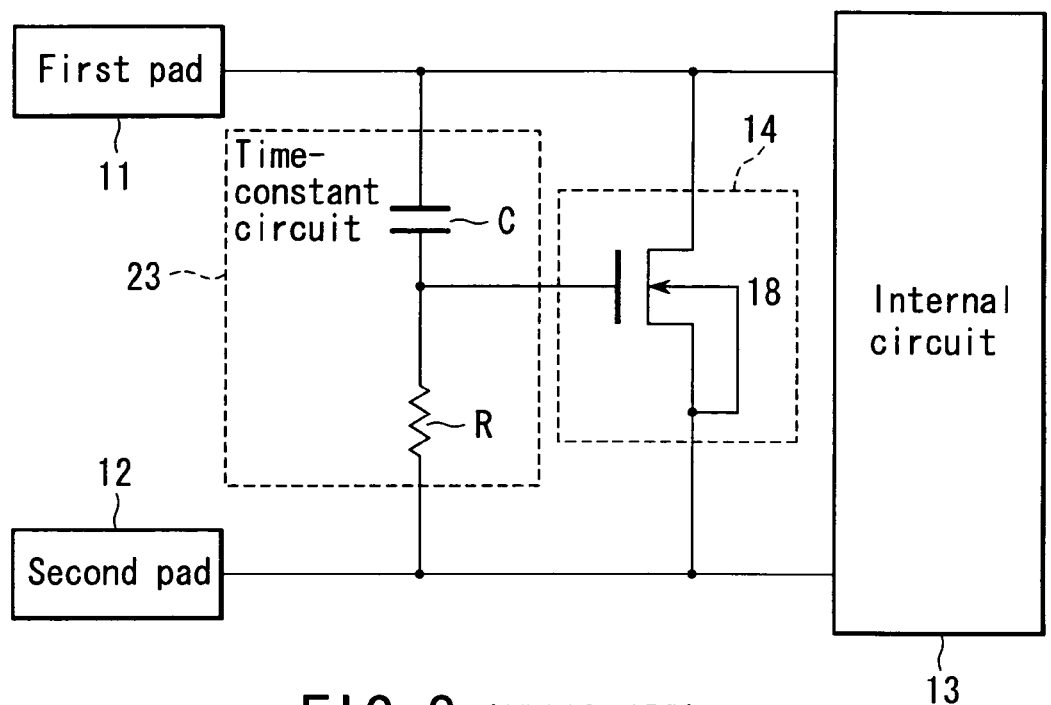
FIG. 3 is a circuit diagram illustrating a second conventional ESD protection circuit.
Figure 4:
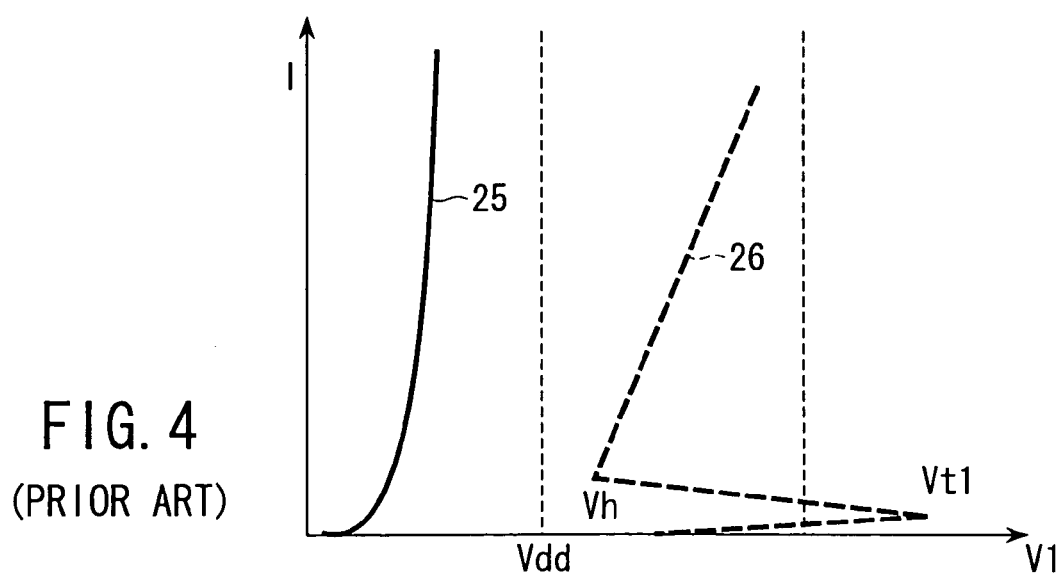
FIG. 4 is a graph representing the voltage-current characteristic of the clamp circuit incorporated in the second conventional ESD protection circuit.
Figure 5:
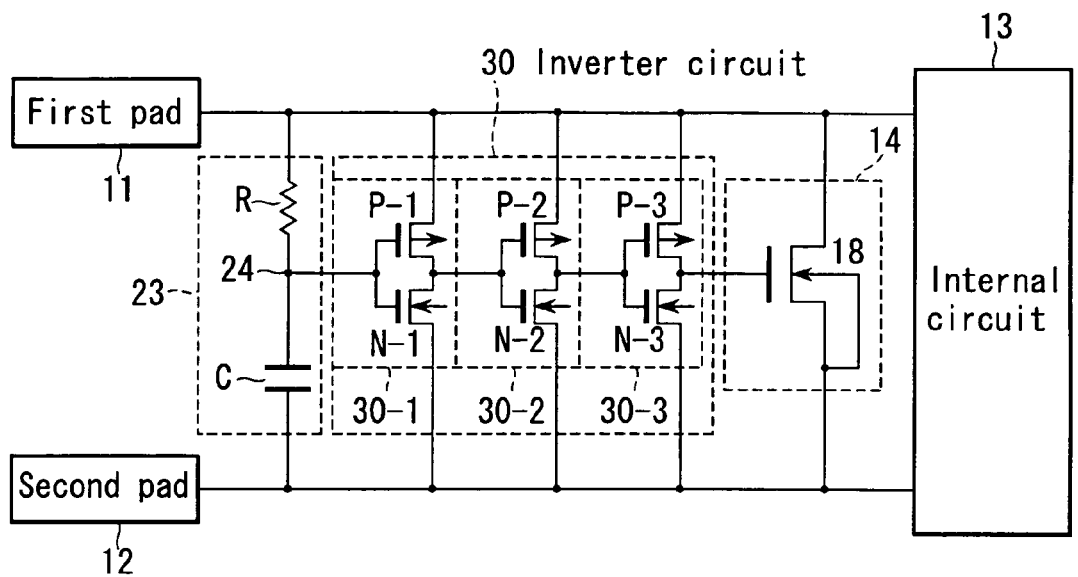
FIG. 5 is a circuit diagram depicting a third conventional ESD protection circuit.

Embodiments of the present invention will be described with reference to the accompanying drawings. In the drawings, the component of each embodiment, which are identical to those of any other embodiment, are designated at the same reference numerals.

Figure 6:
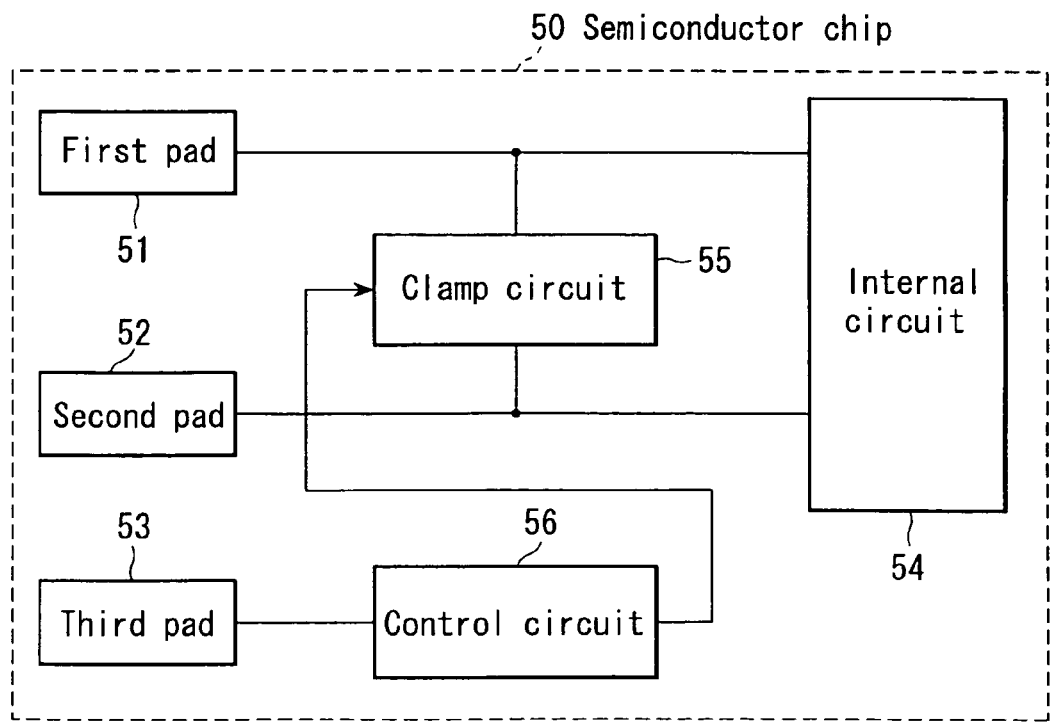
FIG. 6 is a block diagram showing an ESD protection circuit according to an aspect of the invention.
Figure 7:
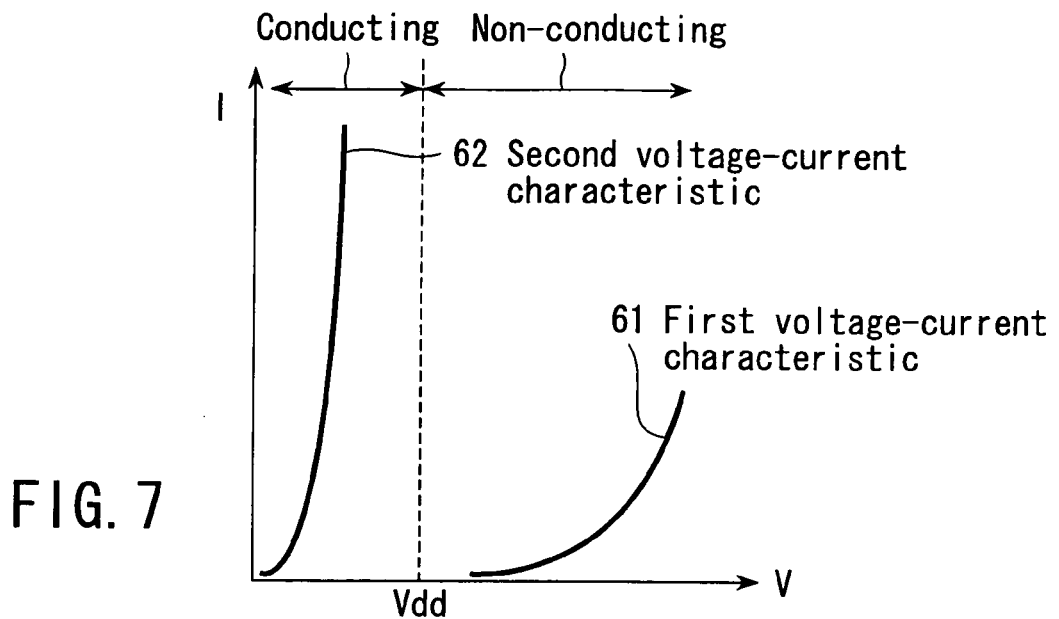
FIG. 7 is a diagram depicting the voltage-current characteristic of the ESD protection circuit shown in FIG. 6.

An ESD-protection circuit according to this invention will be first described, with reference to FIGS. 6 and 7.

As FIG. 6 shows, a semiconductor chip 50 contains an internal circuit 54 that should be protected from ESD. The ESD protection circuit comprises three pads 51, 52 and 53, a clamp circuit 55 and a control circuit 56, all provided in the semiconductor chip 50. The first pad 51 and the second pad 52 are connected to the internal circuit 54. The clamp circuit 55 is provided between and connected to the first pad 51 and the second pad 52. The third pad 53 is connected to the control circuit 56. The control circuit 56 generates a signal, which can turn on and off the clamp circuit 55.

How the ESD protection circuit of FIG. 6 operates will be described with reference to FIG. 7. FIG. 7 schematically represents the voltage-current characteristic of the clamp circuit 55 shown in FIG. 6. In FIG. 7, the voltage V applied to the clamp circuit 55 is plotted on the abscissa and the current I flowing in the clamp circuit 55 is plotted on the ordinate. The solid line 61 indicates the first voltage-current characteristic, and the solid line 62 the second voltage-current characteristic.

The operation of the ESD protection circuit will be explained on the assumption that no high voltage resulting from ESD is applied between the first pad 51 and the second pad 52 after the semiconductor chip 50 has been incorporated into an end product.

Here, the chip 50 may be, for example, an LSI, and the end product may be an electronic apparatus, a household apparatus, or the like. Thus, the semiconductor chip 50 may normally operate in predetermined conditions. As long as the semiconductor chip 50 operates in the predetermined conditions, a high voltage resulting from ESD is scarcely applied to the internal circuit 54. Hence, the clamp circuit 55 is set to the first voltage-current characteristic indicated by the solid line 61 and is turned off.

Once the semiconductor chip 50 has been incorporated into the end product, a signal can be supplied to the third pad 53 to control the control circuit 56 appropriately. When the control circuit 65 is so controlled, the clamp circuit 55 is set to the first voltage-current characteristic indicated by the solid line 61. While the clamp circuit 55 maintains the first voltage-current characteristic, no currents flow at a low voltage V as seen from the solid line 61 shown in FIG. 7.

That is, the clamp circuit 55 remains off while set to the first voltage-current characteristic.

Therefore, the clamp circuit 55 don't imposes on influence on the internal circuit 54. The internal circuit 54 can operate in normal way.

Before the semiconductor chip 50 is incorporated into the end apparatus, a high voltage resulting from ESD may be applied between the first pad 51 and the second pad 52. It will be described how the ESD protection circuit (FIG. 6) operates before the chip 50 is incorporated into the end apparatus.

More specifically, a high-voltage resulting from ESD may be applied to the semiconductor chip 50 before the chip 50 is mounted on a PC board right after it has been made in a factory of the semiconductor manufacturer. In such case, the clamp circuit 55 is set to the second voltage-current characteristic indicated by the solid line 62. Thus, a high voltage can be applied to the clamp circuit 55 at any time. In other words, the clamp circuit 55 maintains the second voltage-current characteristic (line 62) and thus remains on. Since the clamp circuit 55 remains on, it can transfer a charge, if any, generated from the high voltage to the ground power supply Vss.

As indicated above, no signals are supplied to the third pad 53 from any external circuit before the chip 50 is incorporated into the end product. Nonetheless, the control circuit 56 sets the clamp circuit 55 to the second voltage-current characteristic (line 62). While the circuit 55 has second voltage-current characteristic (line 62), a large current I can flow at a low voltage in the circuit 55 as illustrated in FIG. 7. Thus, the clamp circuit 55 can be turned on.

Hence, the voltage resulting from ESD and applied between the pads 51 and 52 is discharged via the clamp circuit 55 even if it is as high as about several thousand volts. That is, the ESD charge is released from the first pad 51 to the second pad 52 through the clamp circuit 55.

No high voltage resulting from ESD is therefore applied to the internal circuit 54. As a result, the internal circuit 54 can be protected from high voltages and prevented from being broken down.

As seen from FIG. 7, the second voltage-current characteristic (line 62) is attributed to an on-current. A large current can therefore flow through the clamp circuit 55. It follows that the circuit 55 can protect the internal circuit 54 very reliably.

Moreover, the control circuit 56 changes the voltage-current characteristic of the clamp circuit 55, from the first characteristic (line 61) to the second characteristic (line 62), or vice versa. In other words, the control circuit 56 sets the clamp circuit 55 to non-conducting state or conducting state. Thus, the ESD protection circuit of FIG. 6 need not satisfy the design requirements as the first conventional ESD protection circuit (FIG. 1). More specifically, the clamp circuit 55 can be designed freely. This makes it easy to manufacture the ESD protection circuit shown in FIG. 6.

Further, in designing the ESD protection circuit (FIG. 6) it is unnecessary to consider the lower withstand voltage of the internal circuit 54, that it should protect against ESD, in the future according to the trend of fine fabrication technology of semiconductor.

The ESD protection circuit shown in FIG. 6 need not have a time-constant circuit. It is free of any process conditions that should be satisfied on account of the time constant of a time-constant circuit. Having no time-constant circuit whatever, the ESD protection circuit can be manufactured at lower cost and in smaller size than otherwise.

[First Embodiment]

Figure 8:
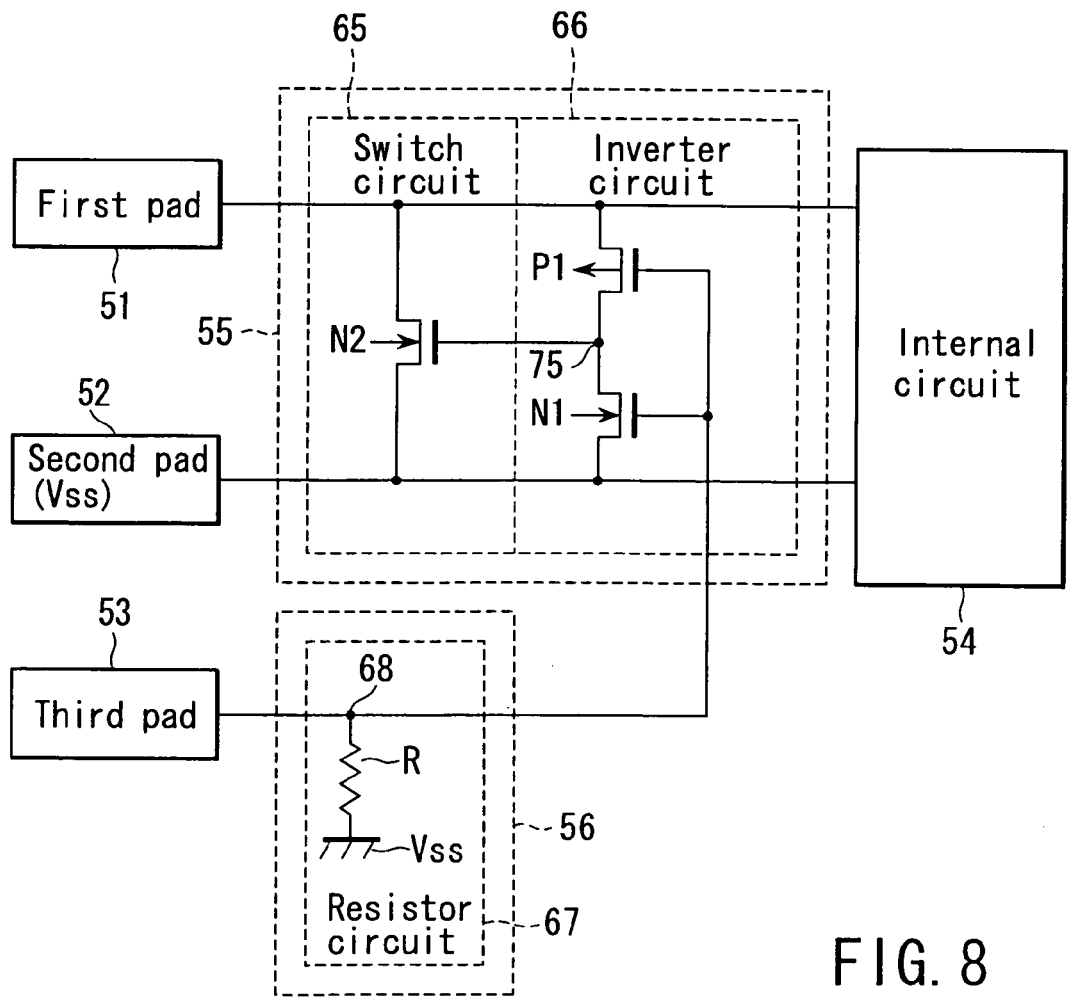
FIG. 8 is a circuit diagram schematically illustrating an ESD protection circuit according the first embodiment of the invention.

An ESD protection circuit according to the first embodiment of the invention will be described, with reference to FIG. 8. FIG. 8 is a circuit diagram that schematically illustrates this ESD protection circuit. The components identical to those of the ESD protection circuit shown in FIG. 6 are designated at the same reference numerals and will not be described. The components not used in the circuit of FIG. 6 will be described in detail.

As FIG. 8 depicts, the clamp circuit 55 comprises a switch circuit 65 and an inverter circuit 66. The control circuit 56 comprises a resistor circuit 67. The second pad 52 is a ground pad and connected the ground power-supply line.

The inverter circuit 66 comprises a PMOS transistor P1 and an NMOS transistor N1. The PMOS transistor P1 has its gate connected to the third pad 53, its source to the first pad 51, and its drain to a node 75. The NMOS transistor N1 has its gate connected to the third pad 53, its source to the second pad 52 and its drain to the node 75.

The switch circuit 65 comprises an NMOS transistor N2. The NMOS transistor N2 has its gate connected to the node 75, its source to the second pad 52 and its drain to the first pad 51.

The resistor circuit 67 comprises a pull-down resistor R. The pull-down resistor R has one end connected to a node 68 and the other end to the ground power supply Vss provided in the integrated circuit, or a semiconductor chip. The node 68 is connected to the third pad 53.

How the ESD protection circuit of FIG. 8 operates will be explained. The voltage-current characteristics that the clamp circuit 55 may have are identical to those illustrated in FIG. 7 and will not be described.

Assume that the semiconductor chip is incorporated in an end product. No high voltage resulting from ESD may be applied between the first pad 51 and the second pad 52. In this condition, the second pad 52 remains connected to the ground power supply Vss of the chip, and the third pad 53 remains connected to the internal power supply Vdd.

An H (high)-level voltage is then applied to the gate of the PMOS transistor P1 and also to the gate of the NMOS transistor N1. The PMOS transistor P1 is turned off, and the NMOS transistor N1 is turned on.

An L (low)-level voltage is therefore applied to the gate of the NMOS transistor N2 via the node 75 from the ground power supply that is connected to the second pad 52. The NMOS transistor N2 is thereby turned off.

As a result, the clamp circuit 55 is turned off. The clamp circuit 55 would not influence the operation of the internal circuit 54. This ensures the normal operation of the internal circuit 54.

Before the semiconductor chip is incorporated into the end product, a high voltage resulting from ESD may be applied between the first pad 51 and the second pad 52. In this case, the resistor circuit 67 connects the third pad 53 to the ground.

The L-level voltage is then applied to the gate of the PMOS transistor P1 and to the gate of the NMOS transistor N1. The NMOS transistor N1 is turned off. The PMOS transistor P1 can be turned on. When the PMOS transistor P1 is turned on, the same voltage will be applied to the gate of the NMOS N2 as to the first pad 51.

At this time the high voltage resulting from the ESD may be applied between the first pad 51 and the second pad 52. Then, the high voltage is applied to the source of the PMOS transistor P1, turning the PMOS transistor P1 completely on.

The high voltage is therefore applied to the gate of the NMOS transistor N2. The NMOS transistor N2 is thereby turned on.

The clamp circuit 55 therefore becomes conducting. The clamp circuit 55 therefore releases the high voltage. Thus, the electrostatic charge (ESD) is discharged from the first pad 51 to the second pad 52 through the clamp circuit 55.

The high voltage resulting from the ESD would not be applied to the internal circuit 54. In other words, the internal circuit 54 can be protected.

The high voltage resulting from the ESD and applied between the pads 51 and 52 is applied to the gate of the NMOS transistor N2. The NMOS transistor N2 is thereby turned on. That is, the clamp circuit 55 uses the on-current of an MOS transistor. Since the on-current flows the channel of the MOS transistor, it is larger than the off-current thereof. The on-current can therefore protect the internal circuit 54 from the high voltage resulting from the ESD, more effectively than the off-current.

The ESD protection circuit according to the first embodiment is not only simple in structure, but larger currents can flow in the clamp circuit 55. The other advantages of this ESD protection circuit are similar to those of the ESD protection circuit illustrated in FIG. 6.

[Second Embodiment]

Figure 9:
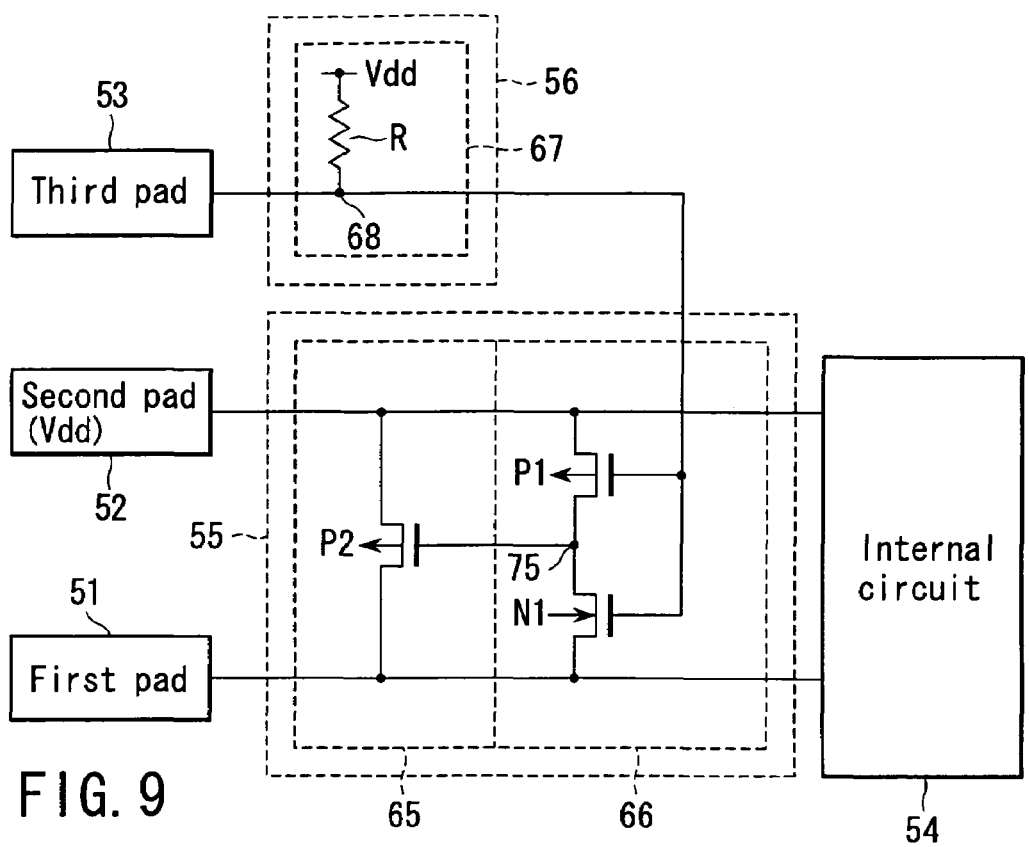
FIG. 9 is a circuit diagram schematically showing an ESD protection circuit according the second embodiment of the invention.

An ESD protection circuit according to the second embodiment of the invention will be described, with reference to FIG. 9. FIG. 9 is a circuit diagram that schematically shows this ESD protection circuit. The components identical to those of the first embodiment shown in FIG. 8 will not be described. The components not used in the circuit of FIG. 8 will be described in detail.

As FIG. 9 depicts, the switch circuit 65 comprises a PMOS transistor P2. The PMOS transistor P2 has its gate connected to a node 75, its source the second pad 52 and its drain to the first pad 51. The pull-up resistor R of the resistor circuit 67 is at one end to the third pad 53. The other end of the resistor R is connected to the internal Vdd provided in the semiconductor integrated circuit, or semiconductor chip. The voltage on Vdd is of positive polarity. The second pad 52, which is a power-supplying pad, is connected to the internal power-supply Vdd.

How the ESD protection circuit of FIG. 9 operates will be described.

Unless a high voltage resulting from ESD is applied between the first pad 51 and the second pad 52, the internal power-supply voltage Vdd is applied to the second pad 52 and the third pad 53 is connected to the ground.

In this case, an L-level voltage is applied to the gate of the PMOS transistor P1 and the gate of the NMOS transistor N1. The PMOS transistor P1 is turned on, and the NMOS transistor N1 is turned off.

Thus, an H-level voltage output from the internal power supply connected to the second pad 52 is applied to the gate of the PMOS transistor P2 through the node 75. The PMOS transistor P2 is thereby turned off.

As a result, the clamp circuit 55 becomes non-conducting (or off). The clamp circuit 55 would not influence the operation of the internal circuit 54. This ensures the normal operation of the internal circuit 54.

Before the semiconductor chip is incorporated into an end product, the high voltage resulting from the ESD may be applied between the first pad 51 and the second pad 52. In this case, the resistor circuit 67 connects the third pad 53 to the internal power supply Vdd. The voltage at the internal power supply Vdd is of the positive polarity.

An H-level voltage is then applied to the gate of the gate of the PMOS transistor P1 and the gate of the NMOS transistor N1. Thus, the PMOS transistor P1 is turned off and the NMOS transistor N1 is turned on.

Therefore, an L-level voltage is applied to the gate of the PMOS transistor P2, as well as to the first pad 51. The PMOS transistor P2 can then be turned on.

If the high voltage resulting of the ESD is applied at this time between the first pad 51 and the second pad 52, it is applied to the source of the PMOS transistor P2. As a result, the PMOS transistor P2 is completely turned on.

This renders the clamp circuit 55 conducting. The clamp circuit 55 therefore discharges the high voltage. The high voltage would not be applied to the internal circuit 54.

As indicated above, the clamp circuit 55 is maintained conducting as long ESD may occur. Hence, a large current can flow in the clamp circuit 55.

In the first and second embodiments, the MOS transistors constituting the clamp circuit 55 may be reversed in conductivity type. In this case, too, the embodiments can have the same advantages as specified above. This technical feature holds true of the other embodiments that will be described below.

[Third Embodiment]

Figure 10:
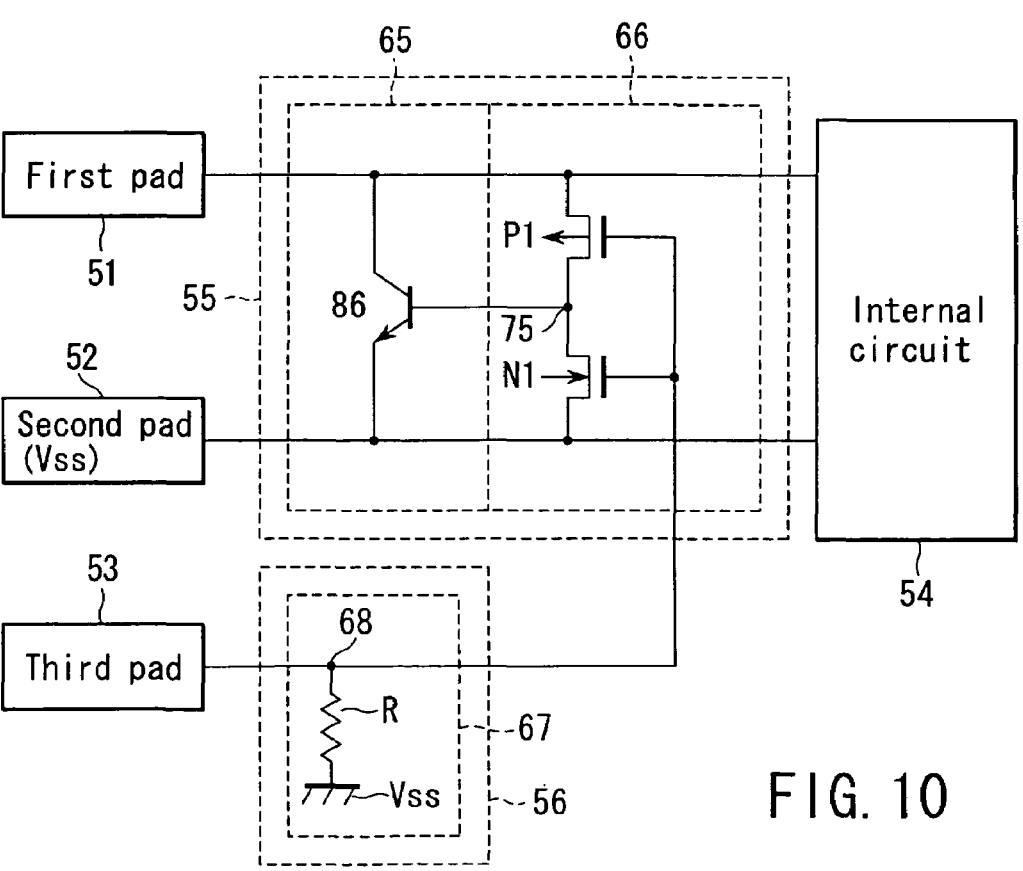
FIG. 10 is a circuit diagram schematically showing an ESD protection circuit according the third embodiment of the invention.

An ESD protection circuit according to the third embodiment of this invention will be described, with reference to FIG. 10. FIG. 10 is a circuit diagram that schematically shows this ESD protection circuit. The components identical to those of the first and second embodiments will not be described. The components not used in the first or second embodiment will be described in detail.

As FIG. 10 shows, the switch circuit 65 comprises a bipolar transistor 86. The bipolar transistor 86 has its collector connected to the first pad 51, its emitter to the second pad 52 and its base to the node 75. The second pad 52 is a ground pad and connected the ground power-supply line provided in a semiconductor integrated circuit, or a semiconductor chip.

How the ESD protection circuit of FIG. 10 operates will be described.

Unless a high voltage resulting from ESD is applied between the first pad 51 and the second pad 52, the ground power-supply voltage Vss is applied to the second pad 52 and the third pad 53 is connected to the internal power supply Vdd.

The NMOS transistor N1 is thereby turned on as in the first and second embodiments. The same voltage is applied to the emitter and base of the bipolar transistor 86. Thus, the bipolar transistor 86 is turned off.

Hence, the clamp circuit 55 becomes non-conducting and would not influence the operation of the internal circuit 54. As a result, the internal circuit 54 can operate in normal way.

Before the semiconductor chip is incorporated into an end product, a high voltage may be applied between the first pad 51 and the second pad 52. If so, the third pad 53 is connected to the ground power supply Vss by the resistor circuit 67.

Then, the PMOS transistor P1 can be turned on as in the first and second embodiments. At this time the high voltage resulting from ESD may be applied between the first pad 51 and the second pad 52. In this case, the high voltage is applied to the source of the PMOS transistor P1 through the first pad 51. The PMOS transistor P1 is completely turned on. The high voltage is therefore applied to the base of the bipolar transistor 86. Meanwhile, the ground power-supply voltage Vss is applied to the emitter of the bipolar transistor 86 via the second pad 52. Hence, the bipolar transistor 86 is turned on.

Thus, the clamp circuit 55 becomes conducting. The high voltage is discharged through the clamp circuit 55. The electrostatic charge (ESD) is discharged from the first pad 51 to the second pad 52 through the clamp circuit 55. This protects the internal circuit 54 from the high voltage.

Generally, bipolar transistor operates faster than MOS transistors and can conduct a larger current than MOS transistors. This further improves the voltage-current characteristic of the clamp circuit 55.

[Modification of the Second Embodiment]

An ESD protection circuit that is a modification of the second embodiment will be described, with reference to FIG. 11. The modified ESD protection circuit differs from the second embodiment in that the switch circuit 65 comprises a PNP bipolar transistor 87.

The PNP bipolar transistor 87 has its collector connected to the first pad 51, its emitter to the second pad 52 and its base to the note 75. The second pad 52 is a power-supplying pad and connected to the internal power-supply Vdd of a semiconductor integrated circuit, or a semiconductor chip.

The modified ESD protection circuit is identical to the ESD protection circuit of FIG. 9, in any other structural aspects. It operates in the same manner as the ESD-circuit.

Figure 11:
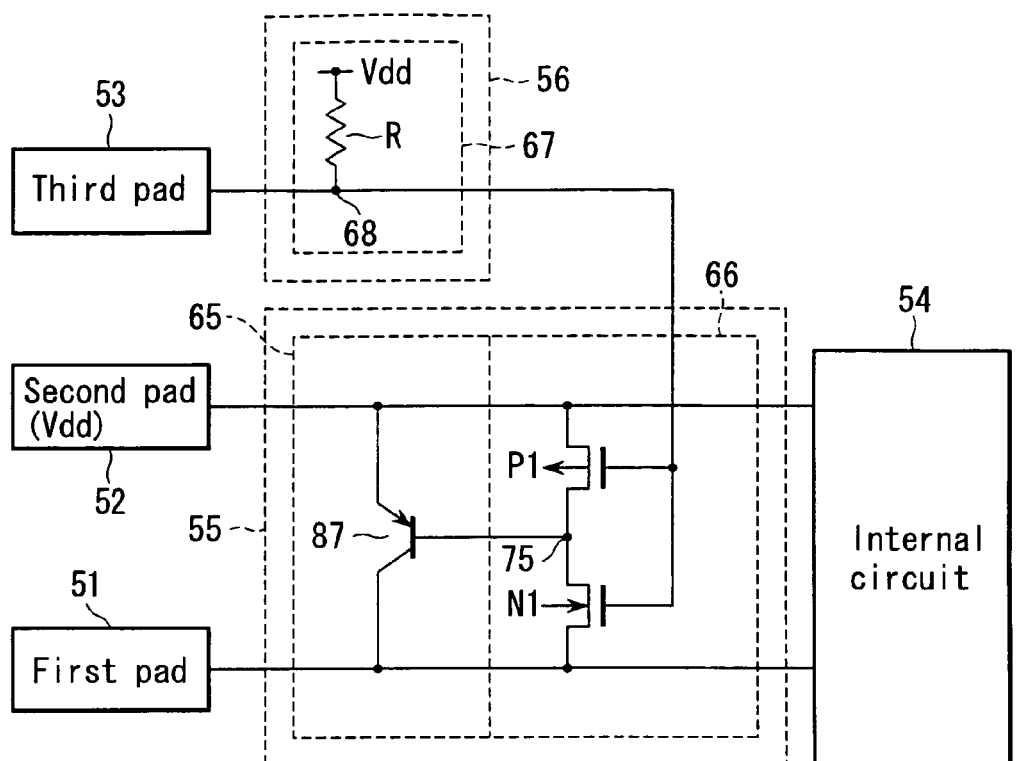
FIG. 11 is a circuit diagram schematically showing a modification of the ESD protection circuit according the second embodiment of the invention.

The modified circuit shown in FIG. 11 can achieve the same advantages as the second embodiment.

[Fourth Embodiment]

Figure 12:
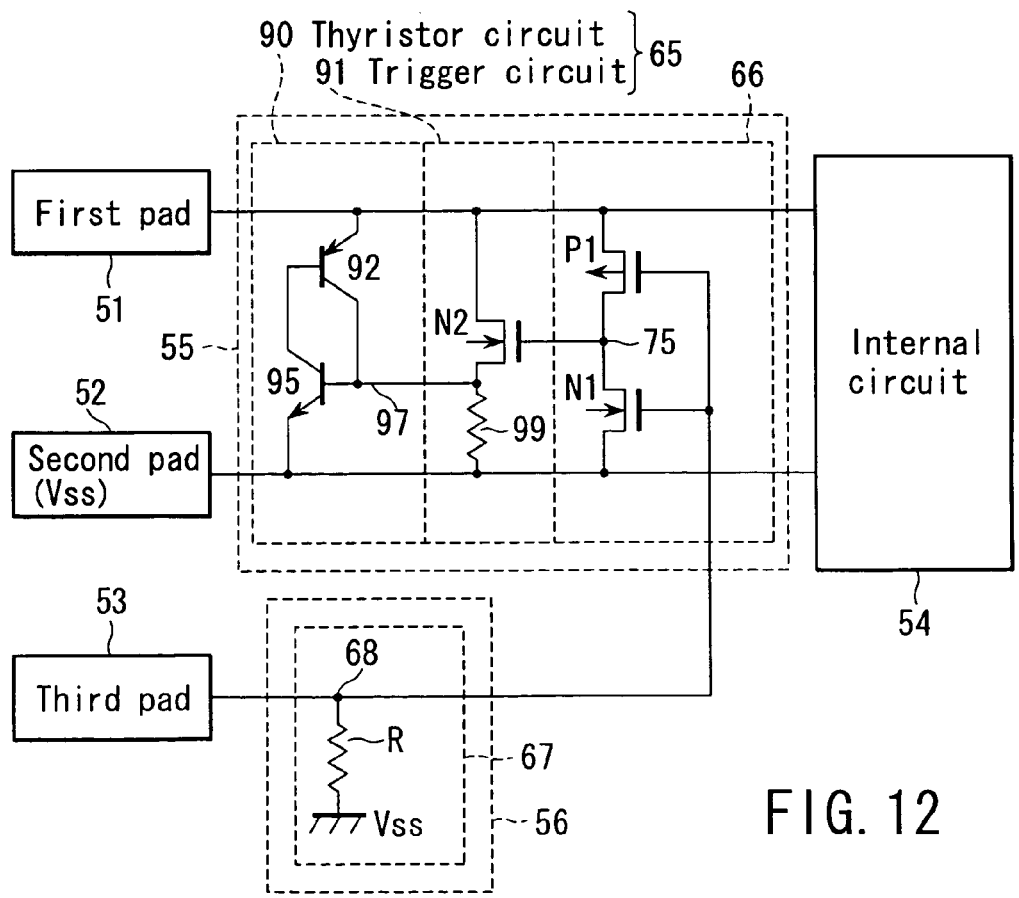
FIG. 12 is a circuit diagram schematically showing an ESD protection circuit according the fourth embodiment of the invention.

An ESD protection circuit according to the fourth embodiment of the invention will be described, with reference to FIG. 12. FIG. 12 is a circuit diagram that schematically shows this ESD protection circuit. The components identical to those of the first, second and third embodiments will not be described. The components not used in the first, second or third embodiment will be described in detail.

As FIG. 12 illustrates, the switch circuit 65 comprises a thyristor circuit 90 and a trigger circuit 91. The thyristor circuit 90 comprises two bipolar transistors 92 and 95. The trigger circuit 91 comprises an NMOS transistor N2 and a resistor 99.

The bipolar transistor 92 has its emitter connected to the first pad 51, its base to the collector of the bipolar transistor 95, and its collector to a node 97. The bipolar transistor 95 has its base connected to the node 97 and its emitter to the second pad 52.

The resistor 99 is connected at one end to the node 97 and at the other end to the second pad 52. The second pad 52 is a ground pad and connected the internal ground power-supply provided in a semiconductor integrated circuit, or a semiconductor chip.

How the ESD protection circuit of FIG. 12 operates will be described.

After the semiconductor chip is incorporated into an end product, the high voltage resulting from ESD may not be applied between the first pad 51 and the second pad 52. If so, the ground power supply Vss is connected to the second pad 52, and the third pad 53 is connected to the internal power supply Vdd.

Then, the NMOS transistor N1 is turned on as in any above-described embodiment. An L-level voltage is thus applied to the gate of the NMOS transistor N2 via the second pad 52. The NMOS transistor N2 is turned off, and the thyristor circuit 90 is turned off.

The clamp circuit 55 becomes non-conducting. It would not influence the operation of the internal circuit 54. The internal circuit 64 can operate in normal way.

Before the semiconductor chip is incorporated into an end product, a high voltage may be applied between the first pad 51 and the second pad 52. In this case, the third pad 53 is connected to the ground by the resistor circuit 67.

Then, the PMOS transistor P1 can be turned on as in the embodiments described above. At this time a high voltage resulting from ESD may be applied between the first pad 51 and the second pad 52. In this case, the high voltage is applied from the first pad 51 to the source of the PMOS transistor P1. The PMOS transistor P1 is thereby completely turned on. The high voltage is therefore applied to the gate of the NMOS transistor N2, too. The NMOS transistor N2 is thus turned on.

Subsequently, the high voltage resulting from ESD is applied via the NMOS transistor N2 to the base of the bipolar transistor 95. An L-level voltage is applied to the emitter of the bipolar transistor 95 from the ground power supply Vss via the second pad 52. The bipolar transistor 95 is thereby turned on.

Further, the L-level voltage is applied to the base of the bipolar transistor 92 via the bipolar transistor 95, due to the ground voltage Vss. Meanwhile, the high voltage resulting from ESD is applied to the emitter of the bipolar transistor 92. As a result, the bipolar transistor 92 is turned on.

The clamp circuit 55 is thereby rendered conducting. The voltage resulting from ESD is therefore applied to the clamp circuit 55, not applied to the internal circuit 54 at all. This makes it possible to extract the ESD charge to the second pad 52 through the thyristor circuit 90. The internal circuit 54 can therefore be protected.

The high voltage is applied across the thyristor circuit 90 as stated above, thus protecting the internal circuit 54 from the high voltage. A larger current can flows in any thyristor circuit of the configuration shown in FIG. 12, than in MOS transistors. It follows that a larger current can flow in the ESD protection circuit of FIG. 12 than in the first, second and third embodiments. In other words, a great current can flow in a smaller area. Thus, the fourth embodiment serves to reduce the size of the semiconductor chip.

[Fifth Embodiment]

Figure 13:
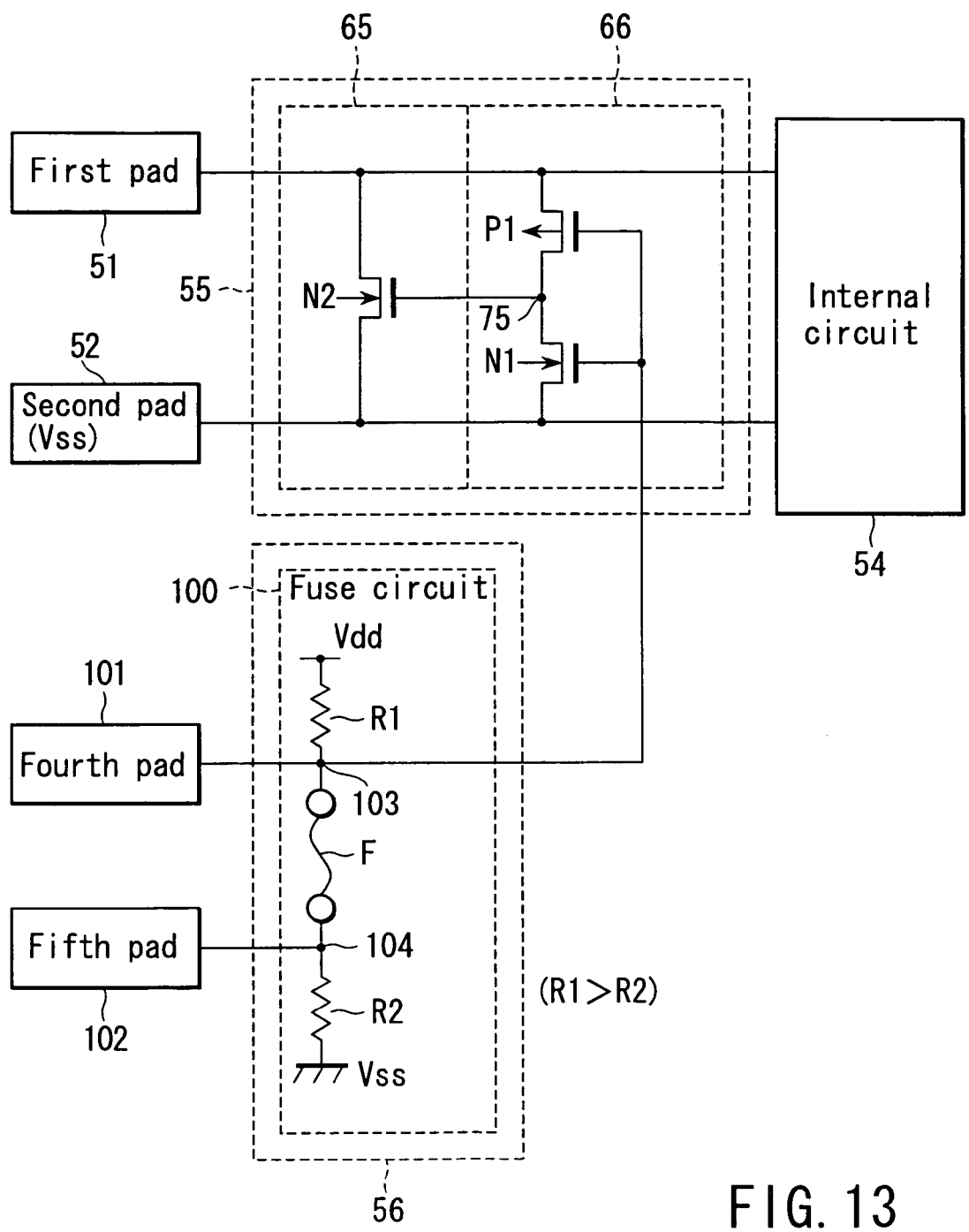
FIG. 13 is a circuit diagram schematically showing an ESD protection circuit according the fifth embodiment of this invention.

An ESD protection circuit according to the fifth embodiment of this invention will be described, with reference to FIG. 13. FIG. 13 is a circuit diagram that schematically depicts this ESD protection circuit. The components identical to those of the embodiments described above will not be described. The components not used in the first to fourth embodiment will be described in detail.

As FIG. 13 shows, the control circuit 56 comprises a fuse circuit 100. The fuse circuit 100 comprises a fuse F and two resistors R1 and R2.

The fuse F is connected at one end to a node 103 that is connected to a fourth pad 101. Its other end is connected to a node 102 that is connected to a fifth pad 102. The resistor R1 is connected at one end to the internal power supply Vdd and at the other end to a node 103. the resistor R2 is connected at one end to the ground power supply Vss and at the other end to a node 104. As in the embodiments described above, the second pad 52 is a ground pad. The pad 52 is connected to the internal ground power-supply line provided in a semiconductor integrated circuit.

How the ESD protection circuit of FIG. 13 operates will be explained.

Before the semiconductor chip is incorporated into an end product, a high voltage may be applied between the first pad 51 and the second pad 52. In this case, the fuse F remains connected. More correctly, after the chip, for example an LSI, is shipped from a factory, a high voltage resulting from ESD may be applied to it before it is incorporated into the end product. This is why the fuse F is held connected, maintaining the clamp circuit 55 in conducting state.

Since the fuse F remains connected, the nodes 103 and 104 are electrically connected. Since the internal power supply Vdd is open, an L-level voltage is applied between the nodes 103 and 104. Therefore, the NMOS transistor N1 and PMOS transistor P1 can be turned off and on, respectively.

When a high voltage resulting from ESD is applied between the first pad 51 and the second pad 52 in this condition, it is applied to the source of the PMOS transistor P1. The PMOS transistor P1 is completely turned on. In the meantime, the high voltage is applied to the gate of the NMOS transistor N2, too. The NMOS transistor N2 is therefore turned on.

Thus, the clamp circuit 55 becomes conducting. The high voltage is applied between the first pad 52 and the second pad 52 via the clamp circuit 55. It would not be applied to the internal circuit 54. In other words, the internal circuit 54 is protected from the high voltage that has resulted from the ESD.

After the semiconductor chip is incorporated into the end product, the high voltage resulting from ESD may not be applied between the first pad 51 and the second pad 52. In this case, the fuse F is melted and cut. More precisely, after the chip, for example an LSI, is mounted on the circuit board of the end product, a high voltage resulting from ESD is seldom applied. Thus, it suffices to cut the fuse F by supplying current between forth pad 101 and fifth pad 102, rendering the clamp circuit 55 non-conducting.

Now that the fuse F has been cut, an H-level voltage is applied to the node 103. The H-level voltage is applied to the gates of the PMOS transistor P1 and NMOS transistor N1. Hence, the PMOS transistor P1 and the NMOS transistor N1 are turned off and on, respectively. Further, an L-level is applied to the gate of the NMOS transistor N2 via the second pad 52. The NMOS transistor N2 is thereby turned off.

Thus, the clamp circuit 55 becomes non-conducting. It would not influence the operation of the internal circuit 54. The internal circuit 54 can therefore operate in normal way.

In the first to fourth embodiments, a voltage must be applied from the third pad 53 to the control circuit 56 as long as the semiconductor chip incorporated in the end produce is used. In the fifth embodiment, a voltage need not be applied to the fourth pad 101 or the fifth pad 102 once the fuse F is cut. This renders it easy to handle the control circuit 56.

In the embodiments described above, the control circuit 56 comprises a resistor circuit 67 or a fuse circuit 100. The control circuit 56 need not be limited to the circuit 67 or 100. Rather, it may be any other circuit that can be programmed in accordance with whether the semiconductor chip has been incorporated into the end product.

The programmable circuit may be, for example, a nonvolatile memory. The internal circuit 54 includes a nonvolatile memory. If so, the programmable circuit can be fabricated at the same time the internal circuit 54 is manufactured. This method can facilitate the manufacture of the semiconductor chip and reduce the manufacturing cost of the chip.

[Sixth Embodiment]

Figure 14:
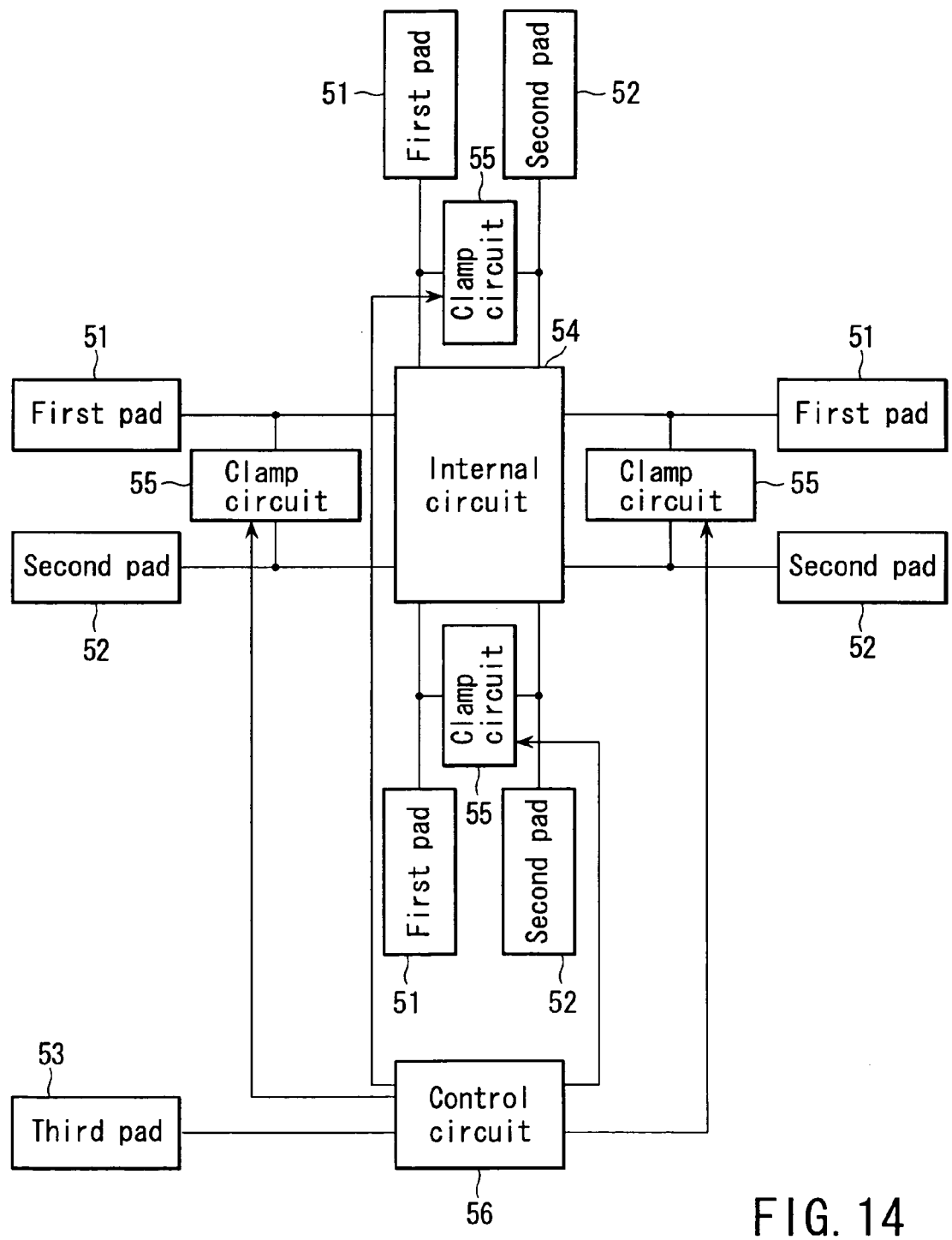
FIG. 14 is a circuit diagram schematically showing an ESD protection circuit according the sixth embodiment of the invention.

An ESD protection circuit according to the sixth embodiment of the invention will be described, with reference to FIG. 14. FIG. 14 is a circuit diagram that schematically shows this ESD protection circuit. The components identical to those of the embodiments described above will not be described. The components not used in the first to six embodiment will be described in detail.

In the first to fifth embodiments, two pads, i.e., the first pad 51 and the second pad 52, are connected to the internal circuit 54. In practice, however, many pads are connected to the internal circuit 54.

As FIG. 14 shows, a number of pads are connected to the external terminals that are provided at four sides of the internal circuit 54. These pads are represented by four first pads 51 and four second pads 52. Four clamp circuits 55 are provided. Each clamp is connected between one first pad 51 and one second pad 52 associated with the first pad 51. A control circuit 56 controls the voltage-current characteristics of the four clamp circuit 55. The control circuit 56 is connected to a third pad 53.

The ESD protection circuit of FIG. 14 operates in the same way as the first to fifth embodiments.

As stated above, many pads are connected to the external terminals that are provided at four sides of the internal circuit 54. Two clamp circuit 55 are provided, one connected between one first pad 51 and one second pad 52 and another between the other first pad 51 and the other second pad 52. Hence, if a high voltage resulting from ESD is applied to any one of the pads, it will be applied to one clamp circuit 55, but not to the internal circuit 54. The ESD protection circuit of FIG. 14 can therefore protect the internal circuit 54.

As specified above, one control circuit 56 controls the voltage-current characteristic of each clamp circuit 55. Thus, additional control circuits need not be provided if other clamp circuits are used in addition to the clamp circuits 55. This helps to lower the manufacturing cost of the ESD protection circuit.

In the embodiments described above, the clamp circuit 55 comprises electronic elements such as MOS transistor, bipolar transistors and thyristors. The elements constituting the clamp circuit 55 are not limited to these, nonetheless. The clamp circuit 55 may comprise any switching elements that can be turned on and off by control signals supplied from the control circuit 56, thereby rendering the clamp circuit either conducting or non-conducting.

The control circuit 56 may comprise a circuit for detecting the power-supply voltage. If this is the case, the control circuit 56 can render the clamp circuit 55 non-conducting while the power-supply voltage is being applied to the internal circuit 54, and conducting while no power-supply voltage is being applied to the internal circuit 54.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ESD protection circuit comprising:
 a first pad which is used as an external connection terminal to be connected to a semiconductor integrated circuit;
 a second pad which is used as an external connection terminal to be connected to the semiconductor integrated circuit;
 a clamp circuit connected to the first pad and the second pad;
 a control circuit which is configured to control the clamp circuit; and
 a third pad which is connected to the control circuit,
 wherein the control circuit is configured to render the clamp circuit conducting when the same potential as applied to the second pad is applied to the third pad before the semiconductor integrated circuit is incorporated into an end product, and to render the clamp circuit non-conducting when a predetermined potential is applied to the third pad after the semiconductor integrated circuit is incorporated into the end product.

2. The ESD protection circuit according to claim 1, wherein the clamp circuit includes a switch element which is rendered to be conducting or non-conducting in accordance with a control signal output from the control circuit.

3. The ESD protection circuit according to claim 1, wherein the clamp circuit includes an inverter circuit which receives a control signal from the control circuit, and a switch circuit which is turned on or off by an output signal of the inverter circuit.

4. The ESD protection circuit according to claim 3, wherein the inverter circuit comprises a first MOS transistor of a first conductivity type, whose source is connected to the first pad and whose gate is connected to receive the control signal from the control circuit, and a second MOS transistor of a second conductivity type, whose drain is connected to a drain of the first MOS transistor, whose source is connected to the second pad, and whose gate is connected to receive the control signal from the control circuit.

5. The ESD protection circuit according to claim 3, wherein the switch circuit comprises a third MOS transistor of the second conductivity type, whose drain is connected to the first pad, whose source is connected to the second pad, and whose gate is connected to an output terminal of the inverter circuit.

6. The ESD protection circuit according to claim 3, wherein the switch circuit comprises an NPN bipolar transistor whose collector is connected to the first pad, whose emitter is connected to the second pad and whose base is connected to an output terminal of the inverter circuit.

7. The ESD protection circuit according to claim 3, wherein the switch circuit comprises a PNP bipolar transistor whose collector is connected to the first pad, whose emitter is connected to the second pad and whose base is connected to an output terminal of the inverter circuit.

8. The ESD protection circuit according to claim 3, wherein the switch circuit comprises a thyristor whose anode and cathode are connected between the first pad and the second pad, and a trigger circuit which supplies a trigger current to the thyristor to turn on or off the thyristor.

9. The ESD protection circuit according to claim 8, wherein the trigger circuit comprises a MOS transistor of a second conductivity type, whose one end of the current path is connected to the first pad and whose gate is connected to an output terminal of the inverter circuit, and a resistor element which is connected at one end to another end of the current path of the MOS transistor and at the other end to the second pad.

10. The ESD protection circuit according to claim 1, wherein the control circuit renders the clamp circuit conducting when no power is supplied to the semiconductor integrated circuit, and renders the clamp circuit non-conducting when power is supplied to the semiconductor integrated circuit.

11. The ESD protection circuit according to claim 1, wherein the control circuit includes a load circuit connected at one end to the third pad and at the other end to a first potential source which generates the predetermined potential.

12. The ESD protection circuit according to claim 11, wherein the load circuit includes a resistor element.

13. The ESD protection circuit according to claim 1, wherein the control circuit comprises a programmable circuit which renders the clamp circuit conducting before the semiconductor integrated circuit is incorporated into an end product, and renders the clamp circuit non-conducting after the semiconductor integrated circuit is incorporated into the end product.

14. The ESD protection circuit according to claim 13, wherein the programmable circuit comprises a fuse circuit which has a fuse element whose one end is connected to the third pad, and the semiconductor chip has a fourth pad which is connected to the other end of the fuse element, a voltage is supplied between the third and fourth pads to cut the fuse element after the semiconductor chip is incorporated into the end product.

15. The ESD protection circuit according to claim 14, wherein the fuse circuit includes a first resistor element which is connected between one end of the fuse element and a first potential source that generates a first potential, and a second resistor element which is connected between the other end of the fuse element and a second potential source that generates a second potential.

* * * * *